United States Patent
Goodell

(10) Patent No.: US 6,175,249 B1
(45) Date of Patent: Jan. 16, 2001

(54) HIGH SPEED LOW SKEW CMOS TO ECL CONVERTER

(75) Inventor: Trenor F. Goodell, Peaks Island, ME (US)

(73) Assignee: Fairchild Semiconductor Corp., South Portland, ME (US)

(*) Notice: Under 35 U.S.C. 154(b), the term of this patent shall be extended for 0 days.

(21) Appl. No.: 09/240,064

(22) Filed: Jan. 29, 1999

(51) Int. Cl.$^7$ .......................... H03K 19/0175; H03L 5/00
(52) U.S. Cl. ................... 326/66; 326/66; 326/77; 326/62; 326/63; 326/121; 327/333
(58) Field of Search .................. 326/66, 77, 62, 326/63, 67, 73, 74, 78, 83, 84, 86, 121; 327/333

(56) References Cited

U.S. PATENT DOCUMENTS

| | | |
|---|---|---|
| 4,645,951 | 2/1987 | Uragami . |
| 4,704,549 | 11/1987 | Sanwo et al. . |
| 4,806,800 | 2/1989 | Khan . |
| 4,939,478 | 7/1990 | Heimsch et al. . |
| 5,004,939 | 4/1991 | Stegherr . |
| 5,117,134 | 5/1992 | Aso . |
| 5,214,317 | 5/1993 | Nguyen . |
| 5,298,810 | 3/1994 | Scott et al. . |
| 5,311,082 * | 5/1994 | Lam ..................................... 307/475 |
| 5,331,229 | 7/1994 | Barre . |
| 5,343,093 | 8/1994 | Tran . |
| 5,352,941 * | 10/1994 | Matsumoto et al. ................. 307/475 |
| 5,410,266 | 4/1995 | Manley . |
| 5,465,057 * | 11/1995 | Takahashi .............................. 326/66 |
| 5,561,382 * | 10/1996 | Ueda et al. ............................. 326/66 |

FOREIGN PATENT DOCUMENTS

| | | |
|---|---|---|
| 0 327 8615 | 12/1991 | (EP) . |
| 0 850 557 A2 | 11/1997 | (EP) . |

* cited by examiner

*Primary Examiner*—Michael Tokar
*Assistant Examiner*—Vibol Tan
(74) *Attorney, Agent, or Firm*—Pierce Atwood; Chris A. Caseiro

(57) ABSTRACT

A logic level converter for translating CMOS logic signals to into differential logic signal pairs such as those associated with ECL levels. The converter includes a first converter branch coupled to the switchable CMOS level input and it provides a first switchable translated output. A second converter branch is not coupled to the input nor is it coupled to the first converter branch. The second converter branch provides a fixed reference signal output around which the output of the first converter branch switches. Changes in the input signal to the first converter branch cause its output potential to be more than or less than the potential of the fixed reference signal supplied by the second converter branch. The components of the respective branches may be tailored to position the fixed signal at a selectable level and to define the differential between the two output signals. The current associated with the converter is mirrored through both branches to minimize the effects of fabrication, temperature, and/or power supply vagaries.

18 Claims, 3 Drawing Sheets

HIGH SPEED LOW SKEW CMOS TO ECL CONVERTER

BACKGROUND OF THE INVENTION

1. Field of the Invention

The present invention relates to circuitry for transmitting electrical signals from one location to another. In particular, the present invention relates to converters for changing the logic levels associated with the operation of Complementary Metal-Oxide-Silicon (CMOS) transistors to the logic levels associated with the operation of emitter-coupled logic (ECL) transistors.

2. Description of the Prior Art

A voltage level converter is used to adjust the logic high and logic low voltage levels associated with a single input signal, or a pair of input signals, coming into the converter to high and low voltage levels compatible with downstream circuitry. The converter must transfer these electrical signals at desired amplitude and rate. The signal transfer occurs between active devices that are either on the same semiconductor-based chip or on different chips. The devices may be located proximate to one another, or they may be some distance from one another. One example of a proximate device interface requiring one or more bus connections is the coupling of one printed circuit board to another within a computing system, such as through a backplane bus. An example of a remote device interface requiring one or more bus connections is the coupling of one computing system to another.

A continuing goal in all computing and communication systems is to be able to transfer electrical signals accurately and as quickly as possible. In order to achieve that goal, it is important that those signals are transmitted at relatively uniform rates, amplitudes, and strengths. This is more likely to occur within a single computing system, less so when interfacing of a plurality of non-uniform computing systems is involved.

It is well known that in digital systems the signals moving between devices are categorized as either logic level high (or "1" or "ON") and logic level low (or "0" or "OFF"). The particular signal potential that defines whether a logic high or a logic low is being transmitted is dependent upon the semiconductor components that form the circuitry associated with that transmission. The most common circuit configurations used to produce digital signals include, among others, CMOS, Transistor-Transistor Logic (TTL), and ECL—positive power rail-based ECL (PECL) in particular. Each of these logic configurations operates differently as a function of the "swing" between what constitutes a logic high signal and what constitutes a logic low signal.

For CMOS logic, which is based primarily on the use of slower, less-power-consuming MOS transistors, a logic low signal is generally developed in the range of 0.6 volts (V) above a low-potential power rail GND, which may be at 0.0 V. A logic high signal is generally developed in the range of Vcc to Vcc–0.6 V, where Vcc may vary between 4.5 V and 5.5 V for a nominal 5-volt supply, or between 3.0 V and 3.6 V for a nominal 3.3-volt supply. For a 3.3-volt supply then, the differential swing between low and high must be at least 2.4 volts in order to ensure that a desired shift between a logic low and a logic high will occur. TTL and ECL logic configurations, on the other hand, are based primarily on the use of faster, high-power-consuming bipolar transistors. The differential swing for a shift between a logic low and a logic high is significantly less than it is for CMOS operation—it may as low as 0.4 volt. In PECL circuitry, which is Vcc dependent, a logic high is equivalent to a potential of about Vcc–0.8 V and a logic low is equivalent to a potential of about Vcc–1.9 V. Thus, in mating CMOS and non-CMOS transmissions, it can be seen that variations in potential swings will not automatically ensure the triggering of a desired swing from one logic level to another. Furthermore, minor potential swings in CMOS signals may not effect any logic level change therein; however, they may be significant enough to cause an unexpected change in a TTL or an ECL logic value when transmitted to a TTL-or an ECL-based system.

Clearly, unexpected changes in logic values are not desirable. They can cause significant operational errors. Therefore, it is important to provide a logic level converter that will not generate excessive signal potential swings—other than those specifically desired to achieve a logic level shift. This problem is more likely to occur as transmission rates are increased. Increasing transmission rates enables the transfer of more data in a shorter time period and so is desirable in many respects. However, the gain in increased transmission rate is often undermined by an increase in signal noise. That is, a rapid change in signal level creates an oscillation about the steady state value corresponding to the sudden switching on or off of a transistor. The extent of the oscillation is dependent upon the particular transistor system used as well as the loading of the downstream-coupled circuit.

As transistors become increasingly smaller in order to achieve the faster transmission rates of interest, the corresponding differential swings associated with their logic outputs are reduced. When the wider-swing CMOS logic systems interface with smaller-swing bipolar-transistor-based logic systems the noise associated with CMOS operation may generate enough of a swing to cause an undesired transistor switching. The signal bounce that occurs with the rapid switching often creates reflections in transmission media. It is therefore important to minimize distortions associated with signal switches. However, efforts to minimize distortions can result in increased signal propagation delays—an undesirable condition in smaller, faster systems. It is also to be noted that with increasingly smaller devices, the effects of fabrication vagaries on signal distortion are magnified. Therefore, to the extent such vagaries can be neutralized, the logic level conversion can be achieved without sacrificing transmission rates.

CMOS-to-ECL converters are well known. Examples of prior converters include the circuits disclosed in U.S. Pat. No. 5,343,093 issued to Tran, U.S. Pat. No. 5,311,082 issued to Lam, and U.S. Pat. No. 5,117,134 issued to Aso. Each of the noted prior devices provides for shifting of the logic levels associated with both of the complementary signals associated with the converter. To that end, they subject both signals to undesirable distortions that can occur during signal transitions. In addition, the Lam converter is referenced to the high-potential power rail and more susceptible to temperature, fabrication, and Vcc changes affecting signal amplitude and transmission rate. The Aso circuit requires an extra switching branch in order to adjust for common-mode effects associated with the MOS-level potentials. An added branch such as this increases the size of the converter—an undesirable prospect when smaller devices are of importance.

Therefore, what is needed is a logic level converter that can translate MOS-level signals into ECL-level signals with minimum propagation delay and little distortion. What is also needed is a logic level converter that is relatively independent of temperature, fabrication, and Vcc vagaries.

Further, what is needed is a logic level converter that is relatively simple to fabricate and that does not take up excess chip space.

SUMMARY OF THE INVENTION

It is an object of the present invention to provide a logic level converter that can translate MOS-level signals into ECL-level signals with minimum propagation delay and little distortion. It is also an object of the present invention to provide such a logic level converter that is relatively independent of temperature, fabrication, and Vcc vagaries. Another object of the present invention is to provide a logic level converter that is relatively simple to fabricate and that does not take up excess chip space.

These and other objectives are achieved in the present invention by establishing one of the two complementary outputs of the converter as a fixed reference signal. That is, one output of the converter remains at a set potential preferably centered within the ECL differential swing range. The other output of the converter is coupled to circuitry such that its potential swings around the potential associated with the fixed reference signal output. The output that is permitted to switch potential is coupled to a first converter branch that is in turn coupled to an input that delivers the switching CMOS-potential-level signal to the converter of the present invention. The fixed reference output is not coupled to the input. Instead, it is coupled to a second converter branch between branch elements that establish a relatively stable potential at a selectable fixed level. The second converter branch includes a first potential drop section and a second potential drop section wherein the fixed reference node is coupled between those two sections. The drops associated with the two potential drop sections of the second converter branch may or may not be symmetrical.

In order to ensure that the swinging output switches between appropriate potentials pursuant to the signal level at the converter's input, the first converter branch includes a first switching section for regulating the potential of the switching output above that of the fixed reference, and a second switching section for regulating the potential of the switching output below that of the fixed reference. The first switching section includes a first input-regulated switch coupled to the high-potential power rail designated Vcc and is in parallel with a first potential-drop element that is also coupled to Vcc. Those parallel components are coupled serially to a second potential-drop element. The second switching section includes a second input-regulated switch coupled to the low-potential power rail designated GND and is in parallel with a third potential drop element that is also coupled to GND. Those parallel components are coupled serially to a fourth potential drop element. The switching output node of the converter is coupled between the second potential-drop element and the fourth potential drop element.

The converter of the present invention is preferably designed such that the current through the first branch mirrors the current through the second branch. In that way, current variations caused by temperature, fabrication, and/or Vcc changes are matched in both branches. Thus, while a current change in the branch coupled to the referenced output may cause a variation in the potential of that output, the same sort of current change will cause a similar modification in the changing potential of the switching output. The potential differential will therefore remain the same in a suitable ECL range. Of course, this technique may be applied to other converters having alternative required potential swings.

The current mirroring associated with the two converter branches is preferably achieved by matching the characteristics of the respective potential drop components associated with each branch. Specifically, the drop associated with the second potential drop element of the first converter branch matches the drop associated with the first potential drop section of the second converter branch. That accounts for relative logic high level swings in that when the first switch is activated, the swinging output of the first branch is at a potential corresponding to a logic high relative to the potential associated with the fixed reference output. Similarly, the drop associated with the fourth potential drop element of the first converter branch matches the drop associated with the second potential drop section of the second converter branch. That accounts for relative logic low level swings in that when the second switch is activated, the swinging output of the first branch is at a potential corresponding to a logic low relative to the potential associated with the fixed reference output.

The first and second switches of the first branch are preferably formed of an inverter that is essentially the only delay component associated with the converter of the present invention. In effect, logic level translations are achieved within one gate delay. That shortest delay possible for a logic level converter, and the mirroring of the designs of the potential drop components in the respective branches, results in minimum propagation delay, very low skew for low-to-high and high-to-low transitions, and minimum pulse width distortion. Both branches share any potential deviations that could be caused by fabrication, temperature, and/or Vcc variations equally such that the desired potential differential will remain substantially constant.

These and other advantages of the present invention will become apparent upon review of the following detailed description, the accompanying drawings, and the appended claims.

DESCRIPTION OF THE PREFERRED EMBODIMENT OF THE INVENTION

Figure 1:
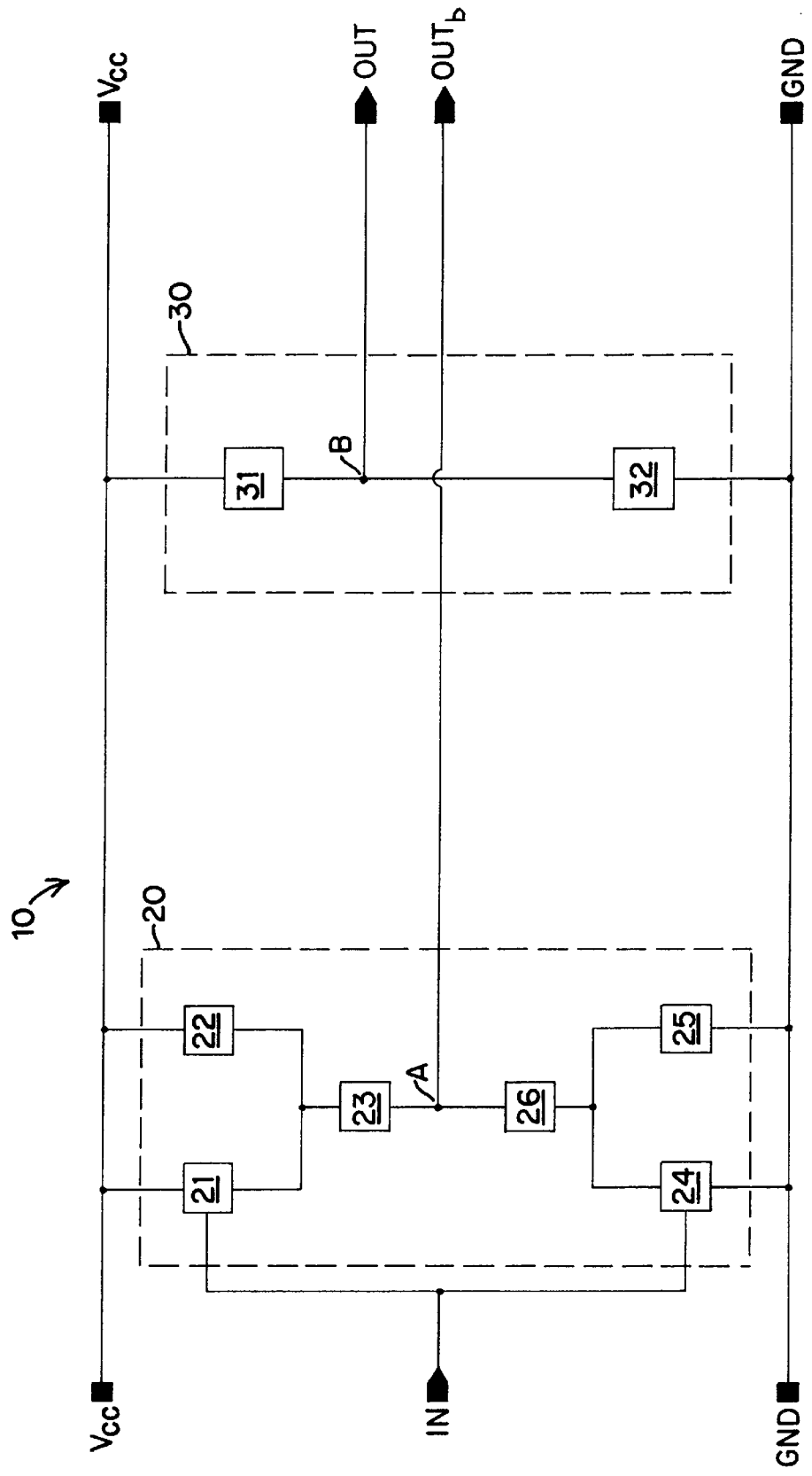
FIG. 1 is a simplified block diagram of the logic level converter of the present invention.

A high speed, low skew, logic level converter 10 of the present invention is shown in simplified form in FIG. 1. The converter 10 is designed to translate a single switching signal at input node IN from a potential associated with CMOS logic levels into a complementary pair of output signals at OUT and OUTb that are at potentials associated with ECL logic levels. It is contemplated that the potentials associated with OUT and OUTb may be developed by the converter 10 at levels other than those related to ECL including, but not limited to Gunning Transceiver Logic (GTL).

The converter 10 of the present invention includes a first converter branch 20 and a second converter branch 30, wherein output node OUTb is coupled to first converter branch 20 and output node OUT is coupled to second converter branch 30. It is to be noted that input node IN is coupled only to first converter branch 20 and therefore only controls the operation of that branch. On the other hand, second branch 30 is not coupled to the switching input. Further, second branch 30 it is not coupled to the first branch 20 and so branch 30 acts completely independent of the signal at IN. As a result, the potential at node OUT remains fixed at a selectable level defined by the drops associated with the components of branch 30.

In order to ensure that a downstream ECL-based circuit is provided with an appropriate differential signal comprising complementary signals at OUT and OUTb, first converter branch 20 includes a first switch component 21, a first potential drop element 22, a second potential drop element 23, a second switch component 24, a third potential drop element 25, and a fourth potential drop element 26. Output node OUTb is coupled between elements 23 and 26 at node A, wherein the potential at node A defines the potential at OUTb. Input node IN is coupled to switch components 21 and 24, such that the CMOS-level signal applied at IN defines which of switch components 21 and 24 is active.

With continuing reference to FIG. 1, switch component 21 has a high-potential node coupled to high-potential power rail Vcc and a low-potential node coupled to a high-potential node of second potential drop element 23. First potential drop element 22 is in parallel with switch component 21 in that it has a high-potential node coupled to high-potential power rail Vcc and a low-potential node coupled to the high-potential node of second potential drop element 23. When switch component 21 is activated by the signal at IN, it short circuits element 22 such that the potential at node A is essentially the potential of Vcc minus the potential drop associated with element 23.

At the other end of first converter branch 20, switch component 24 has a low-potential node coupled to low-potential power rail GND and a high-potential node coupled to a low-potential node of fourth potential drop element 26. Third potential drop element 25 is in parallel with switch component 24 in that it has a low-potential node coupled to low-potential power rail GND and a high-potential node coupled to the low-potential node of fourth potential drop element 26. When switch component 24 is activated by the signal at IN, it short circuits element 25 such that the potential at node A is essentially the potential of GND plus the potential drop associated with element 26. Of course, converter 10 is designed such that switch components 21 and 24 are not active at the same time.

As illustrated in FIG. 1, second converter branch 30 is a relatively simple sub-circuit. It includes a first potential drop element 31 and a second potential drop element 32. First potential drop element 31 has a high-potential node coupled to Vcc and a low-potential node coupled to a high-potential node of second potential drop element 32. Second potential drop element 32 has a low-potential node coupled to GND. Output node OUT is coupled between elements 31 and 32 at node B, wherein the potential at node B defines the potential at OUT.

The electrical characteristics of elements 31 and 32 are preferably selected to define the fixed potential at node B which is preferably centered within the range of potentials associated with the logic levels for the downstream differential circuitry. The similarity of the elements of those components of the two distinct branches of the converter 10 to be described herein with reference to FIG. 2 ensures a mirroring of the current through each branch. That feature, in addition to a centering of the signals between the potentials associated with Vcc and GND, cancels or minimizes the effects of fabrication, temperature, and/or Vcc vagaries.

Figure 2:
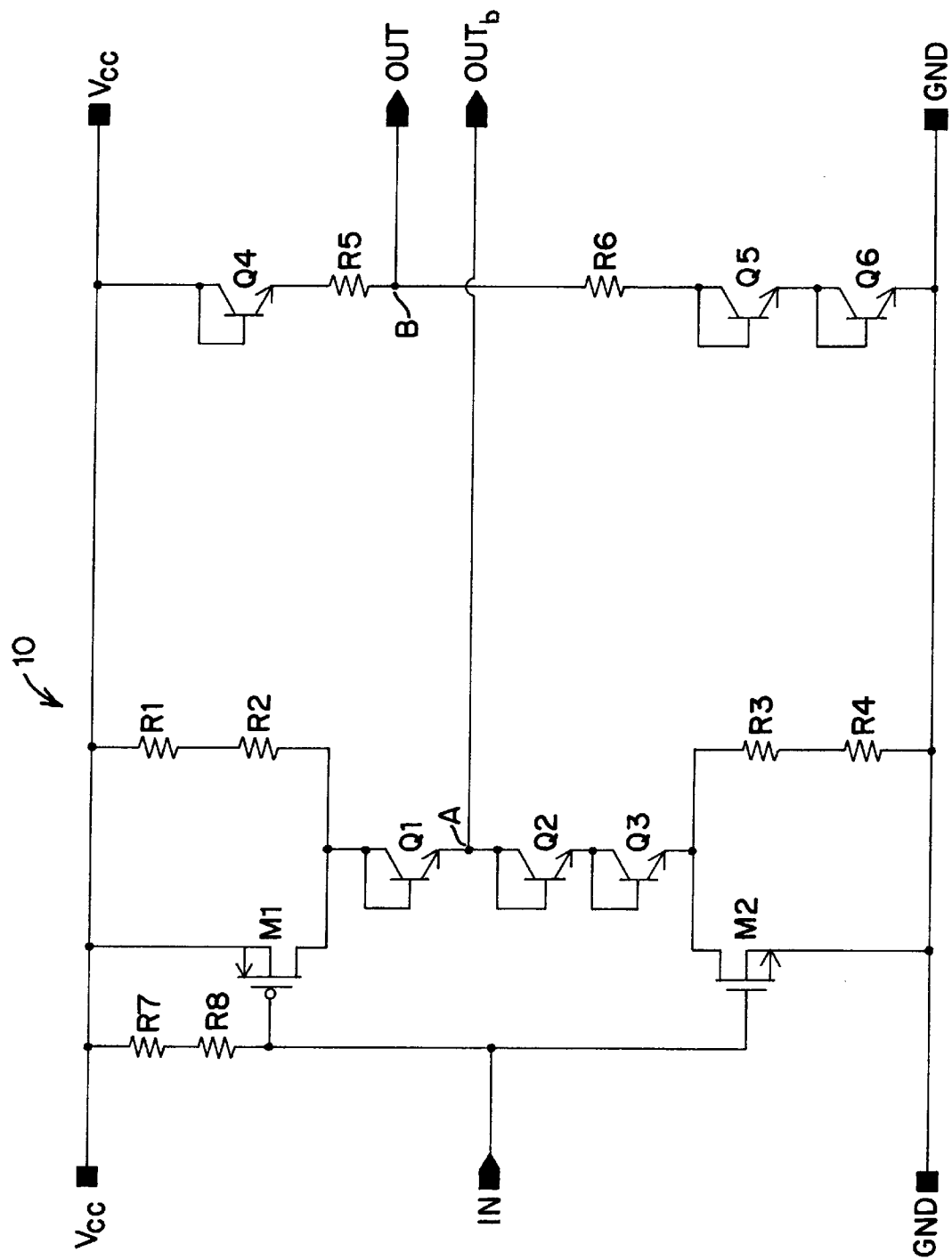
FIG. 2 is a simplified schematic diagram of the preferred design of the logic level converter of the present invention.

A preferred detailed design of the high speed, low skew converter 10 of the present invention is shown in FIG. 2. The first converter branch 20 of the preferred design of the converter 10 includes an inverter formed of transistors M1 and M2, wherein M1 is a PMOS transistor corresponding to switch component 21 of FIG. 1 and M2 is an NMOS transistor corresponding to switch component 24 of FIG. 1. Input node IN is coupled to the gates of transistors M1 and M2 such that a logic high at IN turns off M1 and turns on M2. Correspondingly, a logic low at IN turns on M1 and turns off M2. The first branch 20 also includes as element 22 resistances R1 and R2 in parallel with M1 such that branch 20 remains conducting when M1 is off. When M1 is on, resistances R1 and R2 are short-circuited. Similarly, resistances R3 and R4 equivalent to element 26 are in parallel with M2 such that branch 20 remains conducting when M2 is off. Correspondingly, when M2 is on, resistances R3 and R4 are short-circuited. Transistor M1 has its source and bulk coupled to Vcc. Transistor M2 has its source and bulk coupled to GND.

Key components of branch 20 shown in FIG. 2 include diode-wired bipolar transistor Q1 corresponding to second drop element 23 and a serial pair of diode-wired bipolar transistors Q2 and Q3, corresponding as a set to fourth drop element 26. Transistor Q1 has its base and collector coupled to the drain of M1 and the low-potential node of R2, and its emitter coupled to node A. Transistor Q3 has its emitter coupled to the drain of M2 and the high-potential node of R3, and its collector and base coupled to the emitter of Q2. Transistor Q2 has its base and collector coupled to node A. It is to be understood that any sort potential drop elements may be used to create elements 23 and 26, including, but not limited to, one or more resistances or one or more diodes. However, it has been determined that diode-wired bipolar transistors offer the sort of operational stability desirable in a high speed, low-skew device. It is to be noted that element 26 may be formed of a single bipolar transistor in the event the translated signal is to be switched symmetrically about the potential centered between the potentials at Vcc and GND.

With continuing reference to FIG. 2, fixed reference branch 30 includes diode-wired bipolar transistor Q4 and resistance R5 in serial combination acting as potential drop element 31. Branch 30 also includes resistance R6 and diode-wired bipolar transistors Q5 and Q6 in serial combination, the combination of which forms potential drop element 32. Q4 has its base and collector coupled to Vcc and its emitter coupled to the high-potential node of R5. R5 has its low-potential node coupled to node B. Q6 has its emitter coupled to GND and its base and collector coupled to the emitter of Q5. Q5 has its base and collector coupled to the low-potential node of resistance R6. R6 has a high-potential node coupled to B. It is to be noted that transistors Q1 and Q4 are of equivalent design and that transistors Q2–Q3 and Q5–Q6 are of equivalent design. As previously indicated, that equivalency and the referencing to a potential centered between Vcc and GND insulate the converter 10 from vagaries that can change the logic level swings desired.

The converter 10 of FIG. 2 operates as follows. Node B remains at a fixed potential equivalent to the potential at GND plus the drops across R6, Q5, and Q6, regardless of the signal potential at either IN or node A. A logic high at IN turns off M1 and turns on M2. With M1 off and M2 on, current passes in branch 20 through R1, R2, Q1, Q2 and Q3 to GND. The potential at node A is therefore the potential at GND plus the drops across Q2 and Q3. The potential of the signal at OUT thereby exceeds the potential of the signal at OUTb by the drop across R6, all else being equivalent. A switch in the signal at IN from logic high to logic low turns off M2 and turns on M1. With M2 off and M1 on, current passes in branch 20 through Q1, Q2, Q3, R3 and R4 to GND. The potential at node A is therefore the potential at GND plus the drops across Q2, Q3, R3, and R4. The potential of the signal at OUTb thereby exceeds the potential of the signal at OUT by the drop across R3+R4−R6. It is therefore necessary to ensure that the potential drop associated with resistance R3 plus resistance R4 is sufficiently distinct from the potential associated with resistance R6 to enable adequate ECL level translation.

It is to be noted that the arrangement of the various components of the preferred design of the invention as shown in FIG. 2 may be modified without deviating from the basic operation of the invention. In particular, transistor Q1 may be coupled directly to Vcc, having its low-potential node coupled to the high potential node of the component including transistor M1 in parallel with resistances R1 and R2. Similarly, transistors Q2 and Q3 may be coupled in series directly to GND, with that stack of two diode-wired transistors having a high-potential node coupled to the section including transistor M2 in parallel with resistances R3 and R4. Further, the positioning of Q4 and R5 may be switched, as well as the positioning of devices R6, Q5, and Q6 of converter branch 30. Also, it can be seen that branches 20 and 30 may switch positions with respect to one another, provided the input signal at IN remains coupled to that branch having the switch components associated with transistors M1 and M2.

While the preferred embodiment of the invention shown with respect to FIG. 2 includes the use of bipolar transistors and resistors, the advantage of simpler CMOS fabrication steps may be employed to create a similar converter. Specifically, diode-connected MOS transistors may be used in place of the bipolar transistors and "long-channel" MOS transistors used for the resistances.

Figure 3:
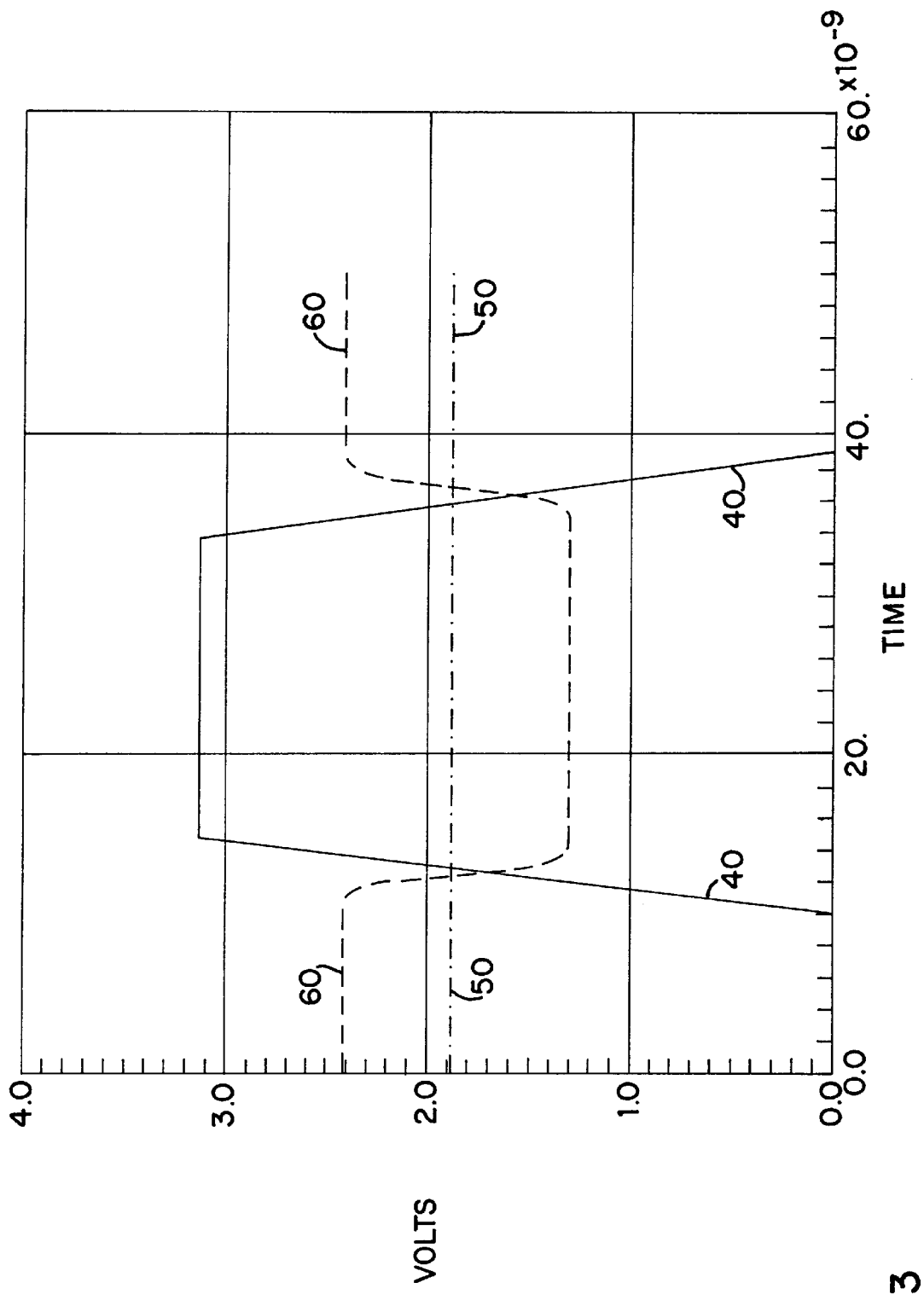
FIG. 3 is a waveform illustrating the switching characteristics of the logic level converter of the present invention shown in FIG. 2.

FIG. 3 provides an illustration of the advantage in using the converter 20 of FIG. 2. Specifically, of the waveforms shown, line 40 is the CMOS-level signal supplied at input IN for a 3.3-Volt supplied system. Line 50 shows the potential associated with the fixed reference output of branch 30 at node B that is coupled to output OUT. Finally, line 60 shows the potential associated with the switching reference output of branch 20 at node A that is coupled to output OUTb. It can be seen by line 50 that the potential at OUT remains fixed and offset from center within the CMOS range of about 0.0 V to 3.15 V at about 1.9 V. This value is defined by the drops across R6, Q5, and Q6, each of which is preferably about 0.6 V. The switching signal at IN causes an inversion of the signal at OUTb substantially centered about the 1.9 V level of the fixed signal at OUT. With particular reference to the example shown in FIG. 3 regarding the converter 10 of FIG. 2, a logic low at IN results in a potential of about 2.4 V at OUTb, corresponding to the potential at GND plus the drops across Q2, Q3, R3, and R4, with each having a potential drop of about 0.6 V. A logic low at IN results in a potential of about 1.3 V at OUTb corresponding to the potential at GND plus the drops across Q2 and Q3. Thus, for the noted example of the present invention, a full-swinging CMOS input can be translated into a differential pair of output signals having a differential of about 0.6 V. This differential is well above the preferred minimum of 0.4 V differential for ECL systems.

In summary, the converter 10 accomplishes CMOS-to-differential-ECL translation by changing the potential of node OUTb with respect to the fixed reference node OUT. To avoid pulse width distortion, the swinging node OUTb is preferably centered about the reference potential. The converter 10 is designed to track across Vcc and process changes as closely as possible. In particular, Q1 and the paired combination of Q2 and Q3 define the maximum excursion of the node OUTb. The current associated with the branch containing those components is mirrored in the reference branch 30 such that changes in the characteristics of those components are mirrored by the reference branch 30. Transistors M1 and M2 form a CMOS converter that effectively shorts the top and bottom resistor pairs, R1–R2 and R3–R4, respectively, so as to move the potential at OUTb about the potential at OUT. Current is maintained in branch 20 at all times to provide base drive for the next circuit stage coupled to converter 10, and to minimize charge/discharge effects in the diode-wired bipolar transistors. It is to be noted that optional resistances R7 and R8 may be used to allow converter 10 to float when not enabled.

While the invention has been described with reference to particular example embodiments, it is intended to cover all modifications and equivalents within the scope of the following claims.

I claim:

1. A logic level converter having one input node for receiving an input signal to be converted, and a pair of output nodes including a first output node and a second output node, said logic level converter comprising:

a. a first converter branch having an input coupled to the input node, a high-potential node coupled to a high-potential power rail, a low-potential node coupled to a low-potential power rail, and an output coupled to the first output node; and b. a second converter branch having a high-potential node coupled to the high-potential power rail, a low-potential node coupled to the low-potential power rail, and an output coupled to the second output node, wherein said second converter branch is not coupled to the input signal, wherein a potential associated with the output of said first converter branch switches with changes in the potential of the input signal, and wherein the output of said second converter branch remains at a fixed selectable potential independent of changes in the potential of the input signal, wherein said fixed selectable potential falls within the range of potentials associated with the switching output potential of said first converter branch, such that the potentials associated with the outputs of said first converter branch and said second converter branch are complements of one another.

2. The converter as claimed in claim 1 wherein said first converter branch includes:

a. a first switch having an input coupled to the input node and a high-potential node coupled to the high-potential power rail, and a second switch having an input coupled to the input node and a low-potential node coupled to the low-potential power rail; and b. a first potential drop element coupled in parallel with said first switch to a second potential drop element and a third potential drop element coupled in parallel with said second switch to a fourth potential drop element, wherein a low-potential node of said second potential drop element is coupled to a high-potential node of said fourth potential drop element, wherein said high-potential node of said fourth potential drop element is coupled to said first output node.

3. The converter as claimed in claim 2 wherein said first switch is a PMOS transistor and said second switch is an NMOS transistor.

4. The converter as claimed in claim 3 wherein said first potential drop element is a first resistance device, said third potential drop element is a second resistance device, said second potential drop element is a first diode device, and said fourth potential drop element is a second diode device.

5. The converter as claimed in claim 4 wherein said first resistance device and said second resistance device each is a pair of resistors coupled together in series.

6. The converter as claimed in claim 5 wherein said first diode device is a diode-wired bipolar transistor and said second diode device is a pair of diode-wired bipolar transistors coupled together in series.

7. The converter as claimed in claim 6 wherein said second converter branch includes a first potential drop section having a high-potential node coupled to the high-potential power rail and a low-potential node coupled to the second output node of the converter, and a second potential drop section having a low-potential node coupled to the low-potential power rail and a high-potential node coupled to said low-potential node of said first potential drop section and to the second output node.

8. The converter as claimed in claim 7 wherein said first potential drop section includes a first diode device coupled in series with a first resistance device, and wherein said second potential drop section includes a second resistance device coupled in series with a second diode device.

9. The converter as claimed in claim 8 wherein said first and second resistance devices of said second converter branch are resistors, said first diode device is a diode-wired bipolar transistor, and said second diode device is a pair of diode-wired bipolar transistors coupled together in series.

10. The converter as claimed in claim 9 wherein said first diode device of said first converter branch and said first diode device of said second converter branch have electrical characteristics that are substantially equivalent, and wherein said second diode device of said first converter branch and said second diode device of said second converter branch have electrical characteristics that are substantially equivalent.

11. The converter as claimed in claim 10 wherein said second resistance device of said first converter branch and said second resistance device of said second converter branch provide potential drops that are not equal.

12. The converter as claimed in claim 4 wherein all of said diode devices are diode-connected MOSFETs and all of said resistances are long-channel MOSFETs.

13. A process for converting an input signal into a pair of complementary output signals, the process comprising the steps of:
   a. directing the input signal to a first converter branch having a first output signal that switches with changes in the potential of the input signal; and
   b. generating through a second converter branch a fixed second signal independent of the input signal,
wherein said first converter branch and said second converter branch are configured such that said first output signal and said fixed second output signal are complements of one another.

14. The process as claimed in claim 13 wherein a potential of said first output signal swings around a potential of said fixed second output signal.

15. The process as claimed in claim 14 further comprising the step of regulating the potential of said first output signal through a first switching means and a second switching means, wherein said first switching means regulates high-potential signals and said second switching means regulates low-potential signals.

16. The process as claimed in claim 15 wherein said first switching means and said second switching means each includes an input-regulated switch and a potential drop element in parallel with said input-regulated switch.

17. The process as claimed in claim 13 comprising the step of mirroring current through said first converter branch and said second converter branch.

18. The process as claimed in claim 17 wherein the step of mirroring current includes the step of matching potential drop characteristics of elements of said first converter branch with potential drop characteristics of elements of said second converter branch.

* * * * *